US010332826B2

(12) United States Patent
Hareyama et al.

(10) Patent No.: US 10,332,826 B2
(45) Date of Patent: Jun. 25, 2019

(54) SEMICONDUCTOR DEVICE AND METHOD OF MANUFACTURING SEMICONDUCTOR DEVICE

(71) Applicant: Sony Corporation, Tokyo (JP)

(72) Inventors: Kosuke Hareyama, Oita (JP); Daisuke Chino, Kanagawa (JP); Yuuji Nishitani, Kanagawa (JP)

(73) Assignee: Sony Corporation, Tokyo (JP)

( * ) Notice: Subject to any disclaimer, the term of this patent is extended or adjusted under 35 U.S.C. 154(b) by 7 days.

(21) Appl. No.: 14/765,929

(22) PCT Filed: Feb. 27, 2014

(86) PCT No.: PCT/JP2014/001046
§ 371 (c)(1),
(2) Date: Aug. 5, 2015

(87) PCT Pub. No.: WO2014/141607
PCT Pub. Date: Sep. 18, 2014

(65) Prior Publication Data
US 2015/0380347 A1 Dec. 31, 2015

(30) Foreign Application Priority Data

Mar. 13, 2013 (JP) ................................ 2013-050141

(51) Int. Cl.
H01L 23/498 (2006.01)
H01L 21/48 (2006.01)
(Continued)

(52) U.S. Cl.
CPC .... H01L 23/49816 (2013.01); H01L 21/4853 (2013.01); H01L 21/4857 (2013.01);
(Continued)

(58) Field of Classification Search
CPC ......... H01L 25/105; H01L 2224/16225; H01L 24/73; H01L 23/4952; H01L 2924/15311;
(Continued)

(56) References Cited

U.S. PATENT DOCUMENTS 5,851,337 A * 12/1998 Chen .................... H01L 23/3128
156/275.3
6,650,016 B1 * 11/2003 MacQuarrie .......... H01L 21/485
228/180.22
(Continued)

FOREIGN PATENT DOCUMENTS

JP H07-022461 A 1/1995
JP 10-335547 A 12/1998
(Continued)

Primary Examiner — Marc Anthony Armand
Assistant Examiner — Sue Tang
(74) Attorney, Agent, or Firm — Michael Best & Friedrich LLP

(57) ABSTRACT

A semiconductor device including a plurality of solder balls on a surface the semiconductor device, and a retaining body associated with a first solder ball of the plurality of solder balls, separating the first solder ball from at least a second solder ball of the plurality of solder balls. The retaining body includes a conductive portion and an insulating portion configured to cover the conductive portion. Also, a method of manufacturing a semiconductor device, including acts of forming a plurality of retaining bodies on a surface of a wiring substrate, each retaining body comprising a conductive portion and an insulating portion covering the conductive portion, each retaining body forming an opening section, and forming a solder ball in the opening section formed by each of the retaining bodies.

2 Claims, 16 Drawing Sheets

(51) Int. Cl.
*H01L 25/10* (2006.01)
*H01L 23/00* (2006.01)
*H01L 23/66* (2006.01)

(52) U.S. Cl.
CPC .. *H01L 23/49822* (2013.01); *H01L 23/49838* (2013.01); *H01L 24/17* (2013.01); *H01L 25/105* (2013.01); H01L 23/66 (2013.01); H01L 24/16 (2013.01); H01L 24/32 (2013.01); H01L 24/73 (2013.01); H01L 2223/6622 (2013.01); H01L 2224/16225 (2013.01); H01L 2224/16227 (2013.01); H01L 2224/32225 (2013.01); H01L 2224/73204 (2013.01); H01L 2225/1023 (2013.01); H01L 2225/1058 (2013.01); H01L 2924/1436 (2013.01); H01L 2924/152 (2013.01); H01L 2924/1511 (2013.01); H01L 2924/1517 (2013.01); H01L 2924/15192 (2013.01); H01L 2924/15311 (2013.01); H01L 2924/15331 (2013.01)

(58) Field of Classification Search
CPC ..... H01L 2225/1023; H01L 2225/1058; H01L 24/16; H01L 2223/6622; H01L 2924/15192; H01L 2224/32225; H01L 2224/73204; H01L 24/32
USPC ........................................................ 257/673
See application file for complete search history.

(56) References Cited

U.S. PATENT DOCUMENTS

| 7,045,893 | B1 | 5/2006 | Peek et al. | |
|---|---|---|---|---|
| 7,516,879 | B1 | 4/2009 | Buchwalter et al. | |
| 9,099,340 | B2* | 8/2015 | Michael | H01L 23/50 |
| 2004/0160752 | A1* | 8/2004 | Yamashita | H01L 23/49894 361/766 |
| 2004/0195701 | A1* | 10/2004 | Attarwala | H01L 24/75 257/783 |
| 2006/0231541 | A1* | 10/2006 | Takada | H05K 1/0212 219/209 |
| 2012/0074566 | A1* | 3/2012 | Youn | H01L 25/16 257/738 |
| 2012/0193789 | A1* | 8/2012 | Hu | H01L 21/56 257/738 |
| 2012/0228769 | A1* | 9/2012 | Chen | H01L 23/3128 257/738 |

FOREIGN PATENT DOCUMENTS

| JP | 2002-026171 A | 1/2002 |
|---|---|---|
| JP | 2010-161419 A | 7/2010 |

* cited by examiner

[FIG. 1]
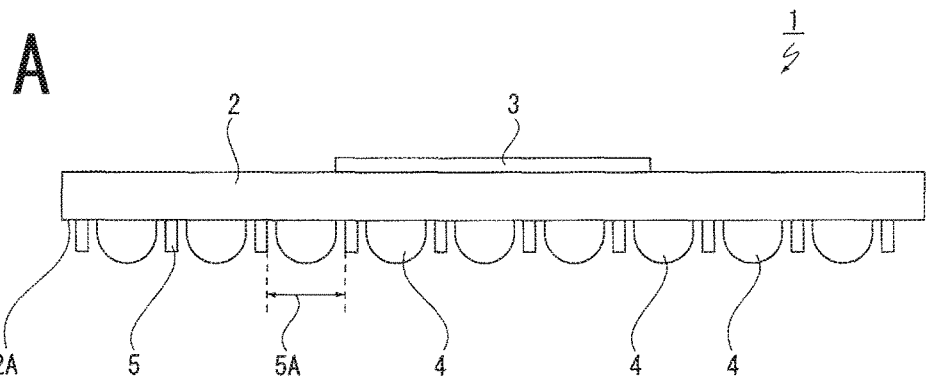
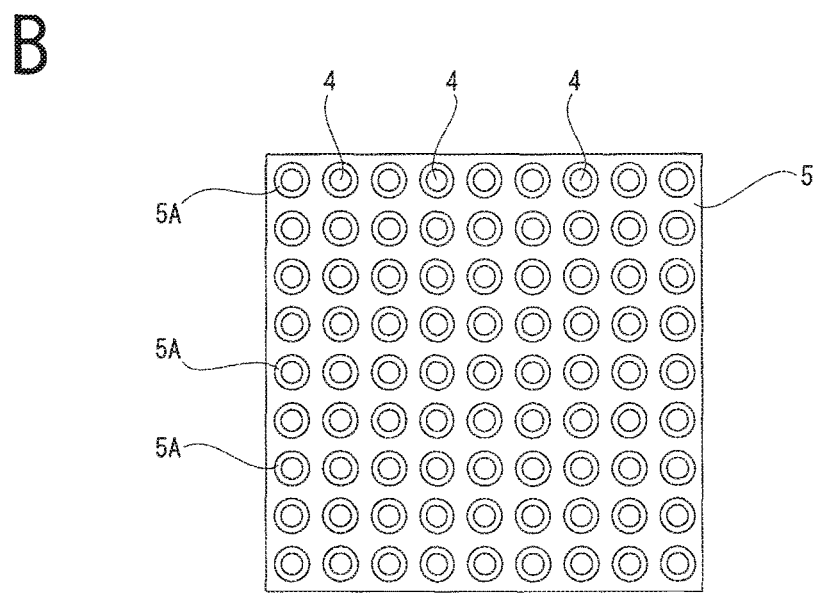
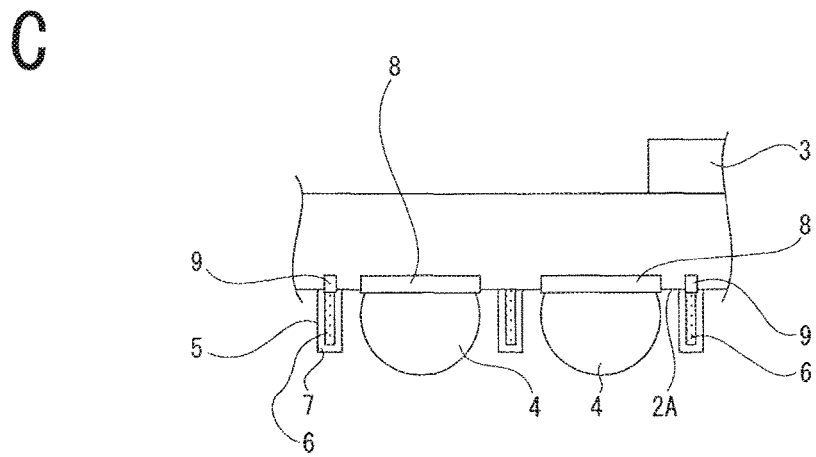

[FIG. 2]
A
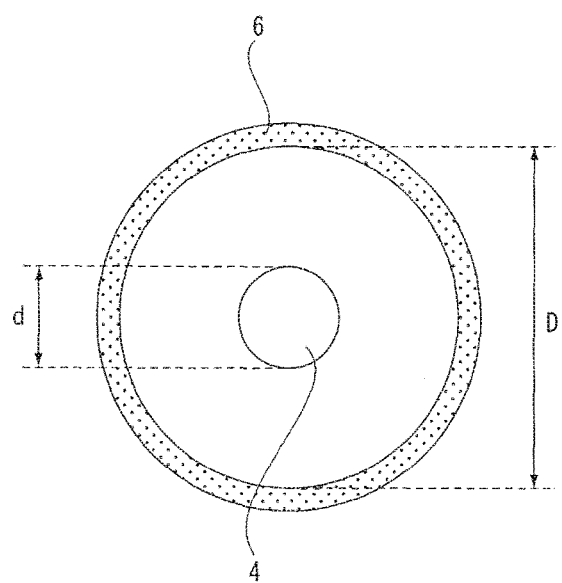
B
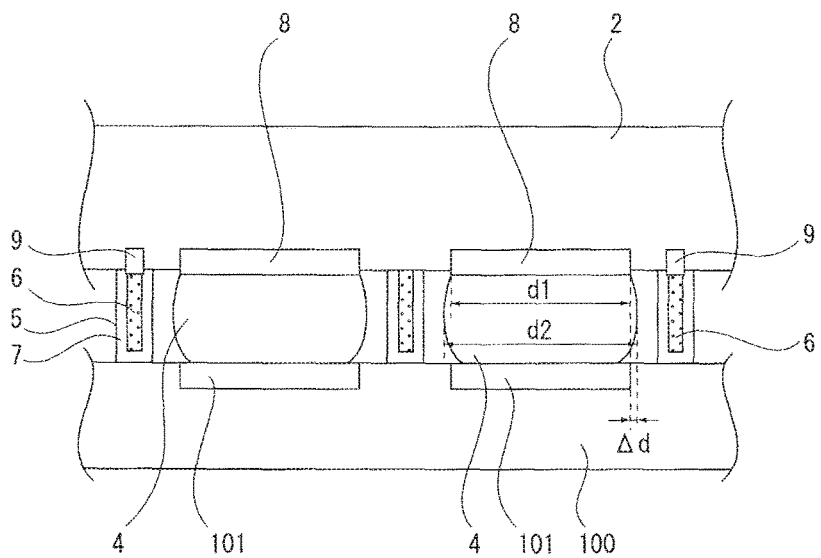

[ FIG. 3 ]
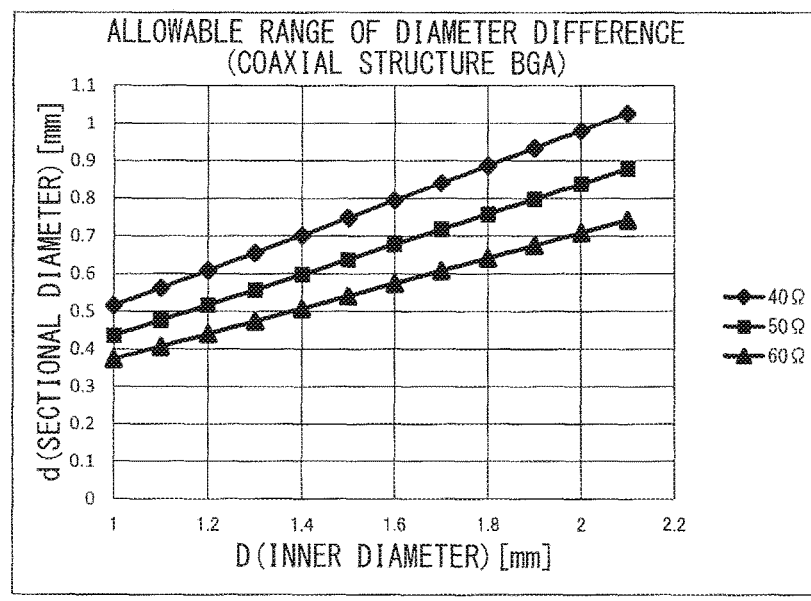

[FIG. 4]
A
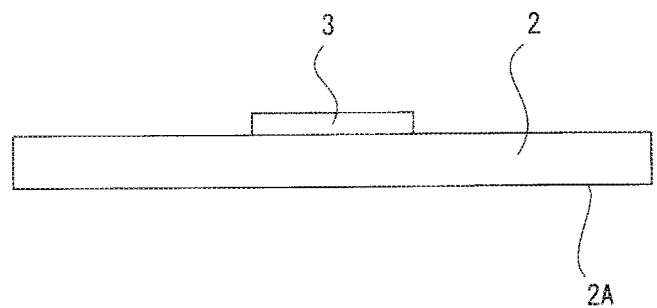
B
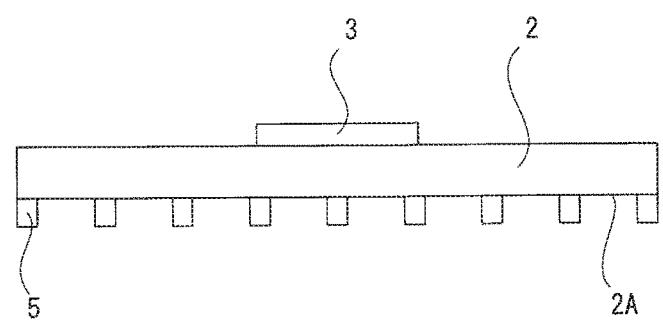
C
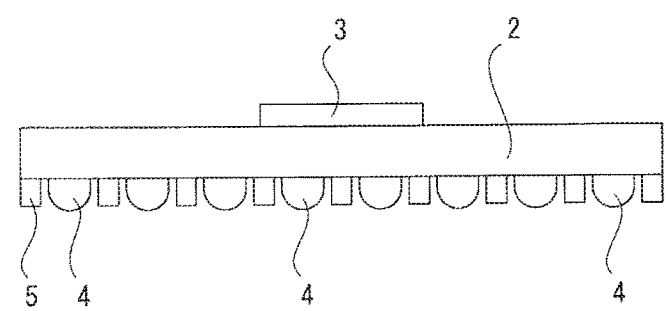

[ FIG. 5 ]
A
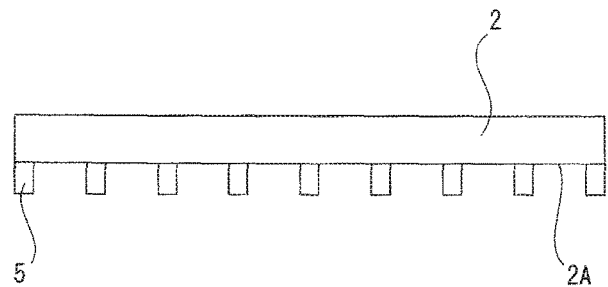
B
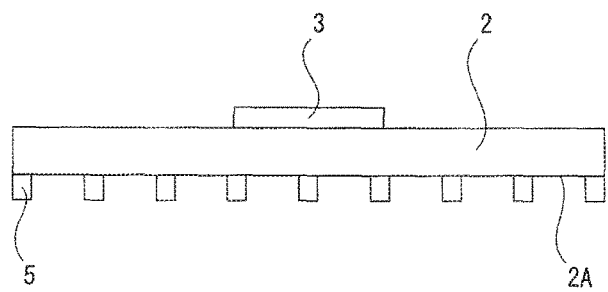
C
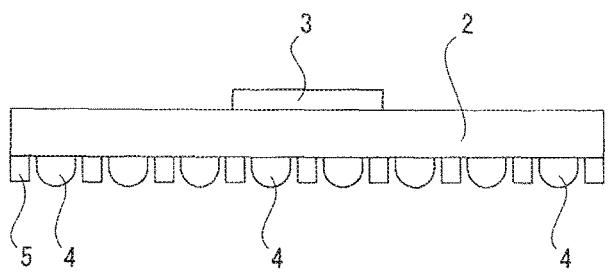

[ FIG. 6 ]
A
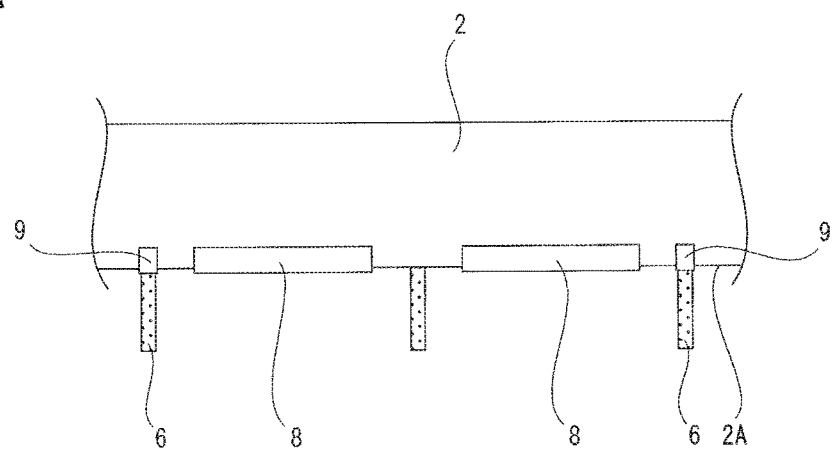
B
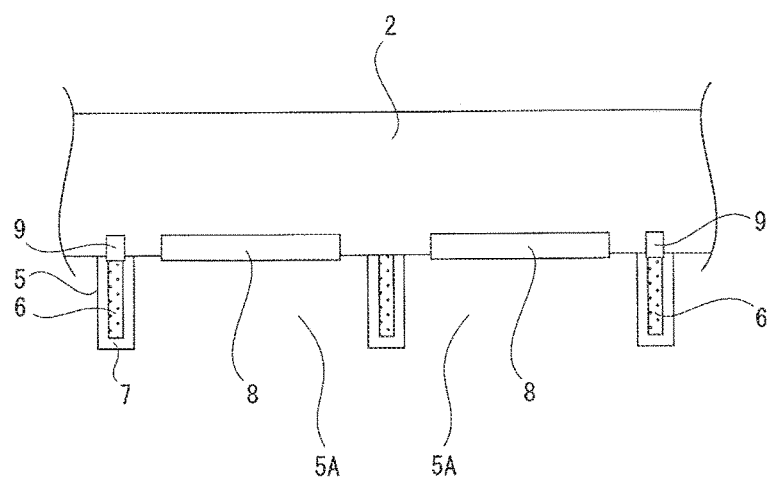

[FIG. 7]
A
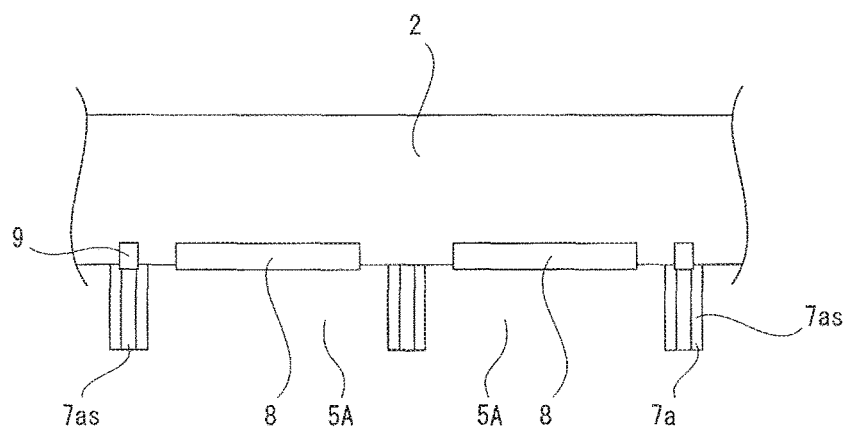
B
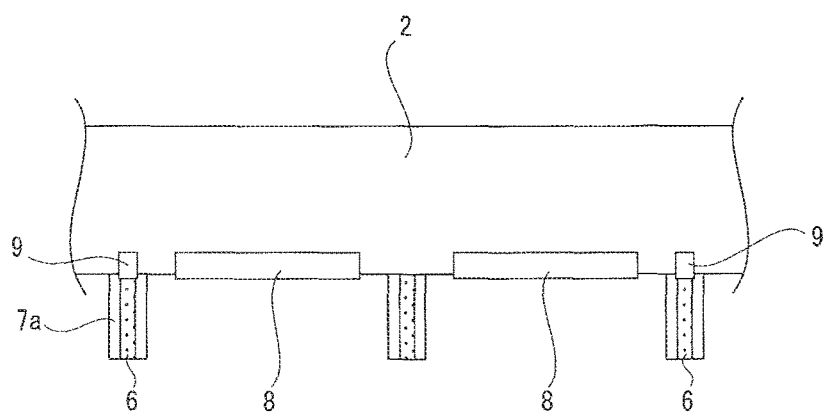
C
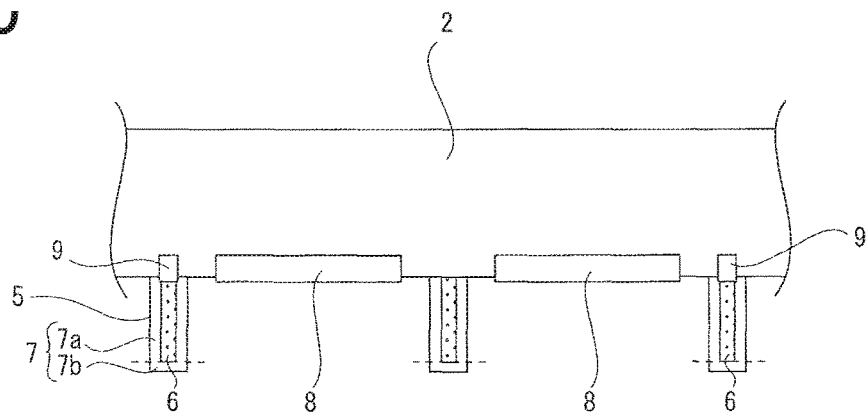

[FIG. 8]
A
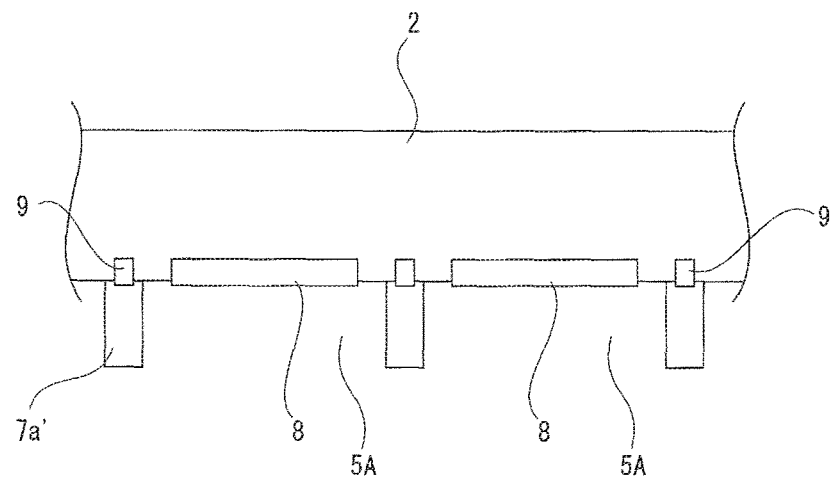
B
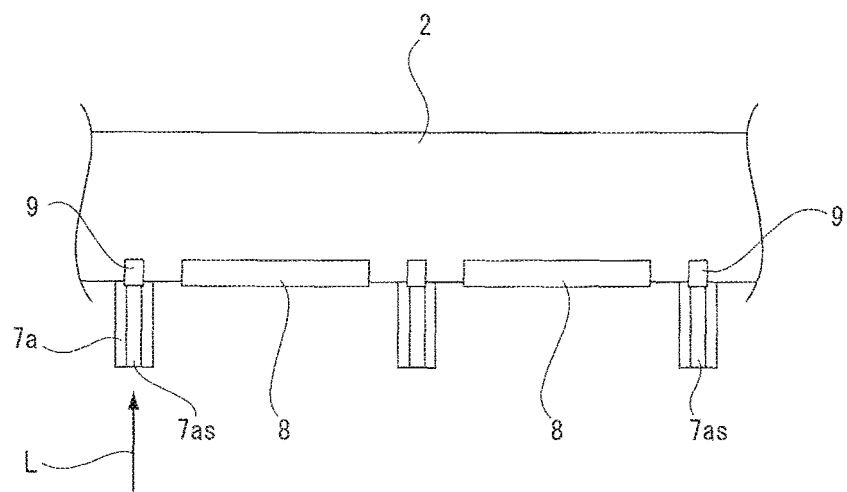

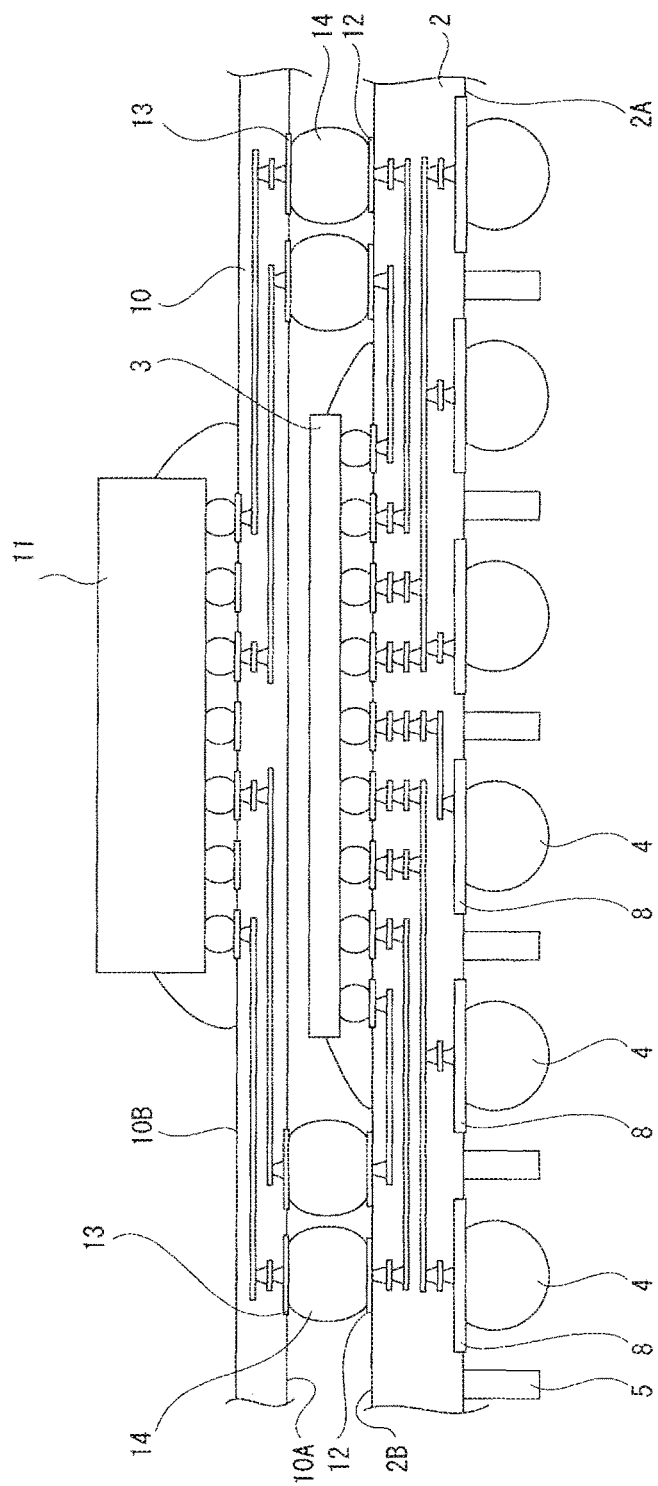
[ FIG. 9 ]

[FIG. 10]
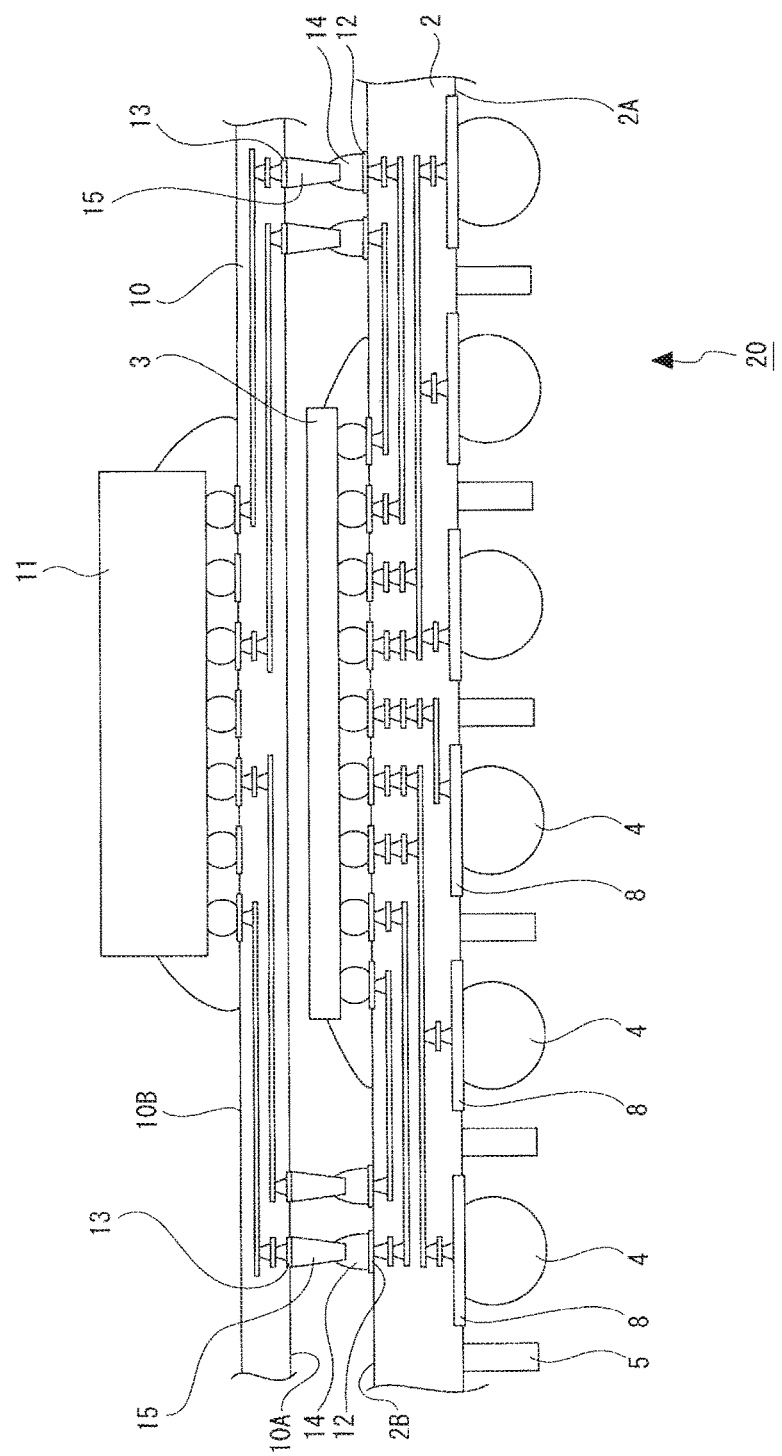

[ FIG. 11 ]
A
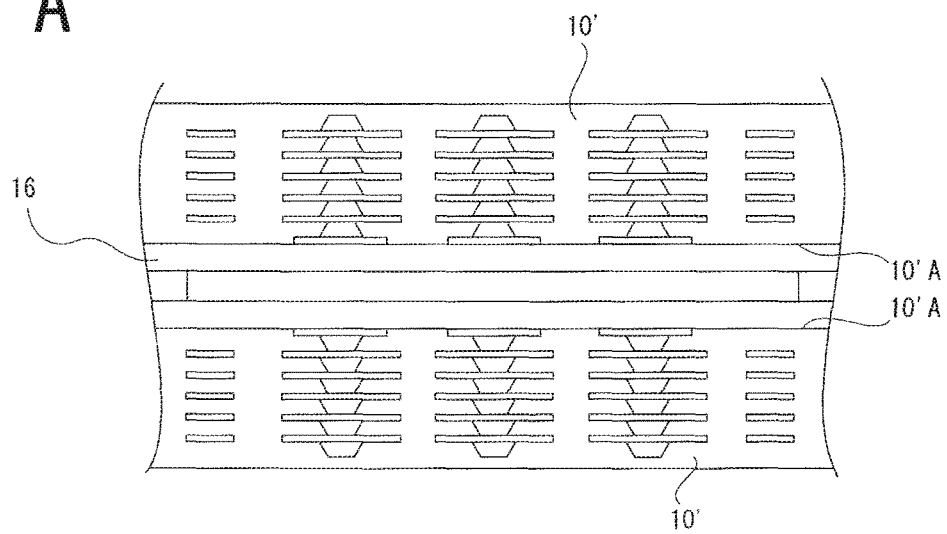
B
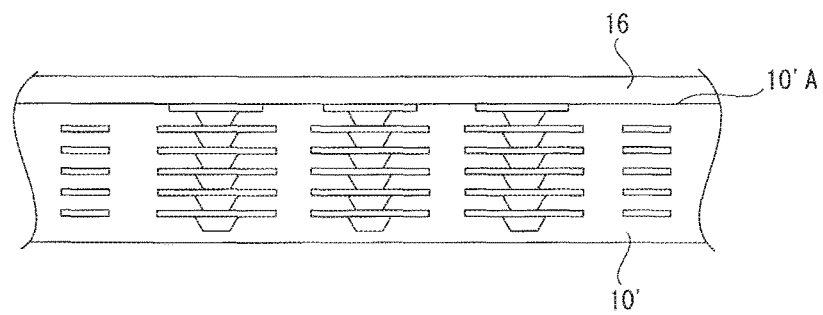
C
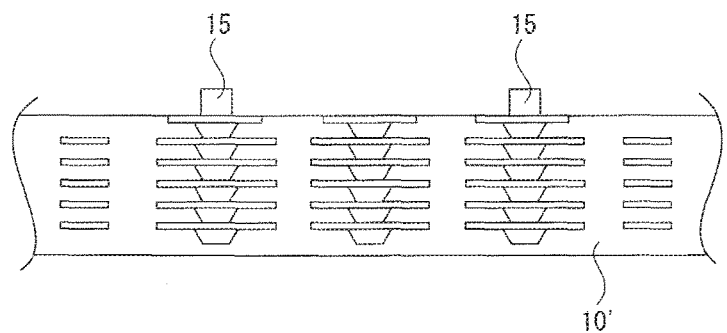

[FIG. 12]
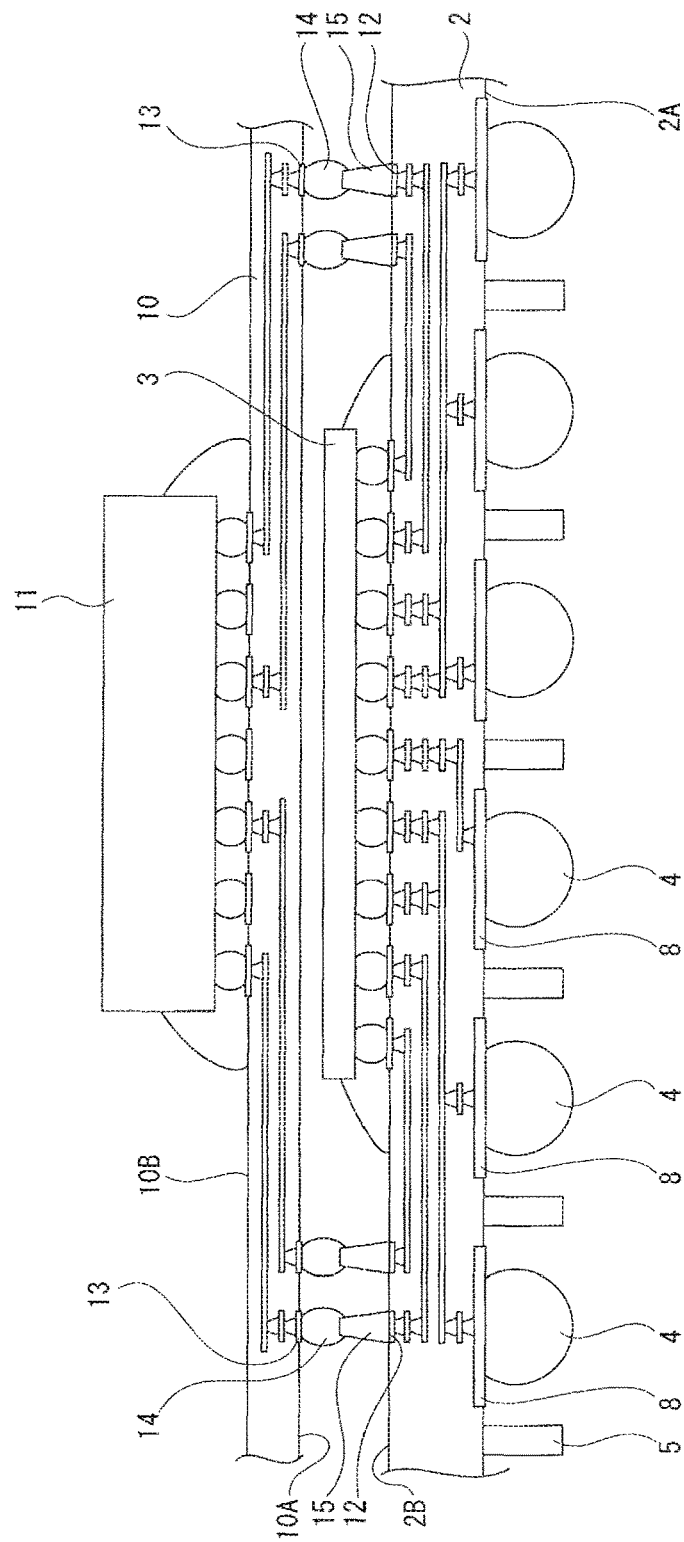

[ FIG. 13 ]
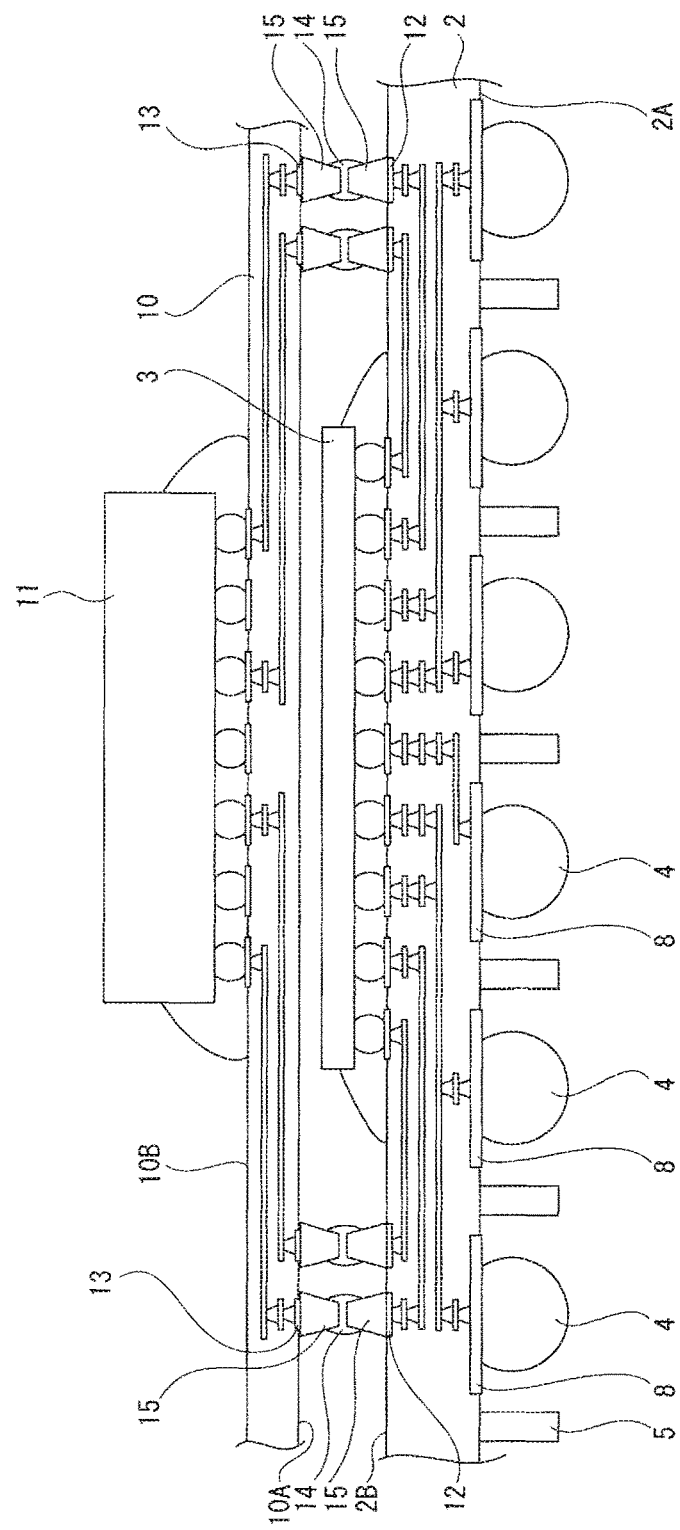

[ FIG. 14 ]
A
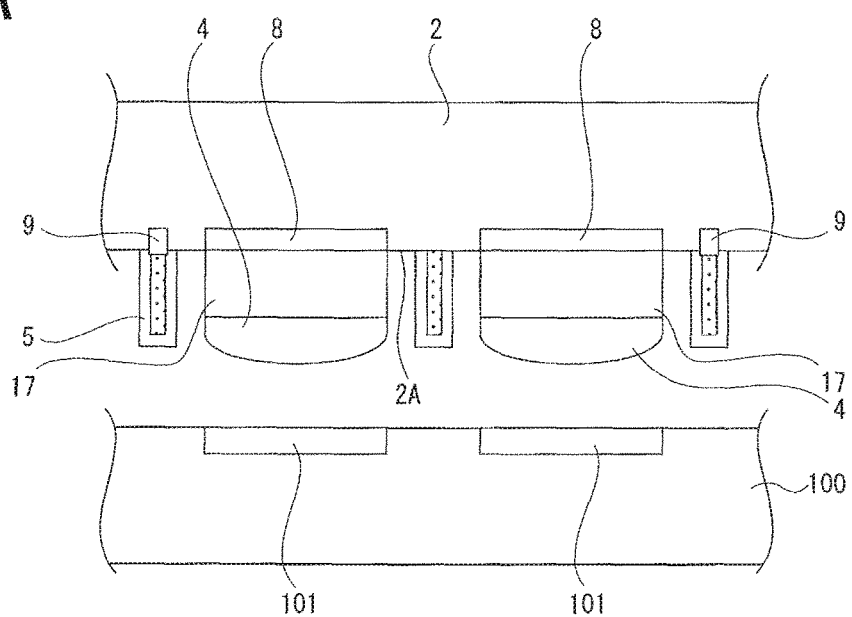
B
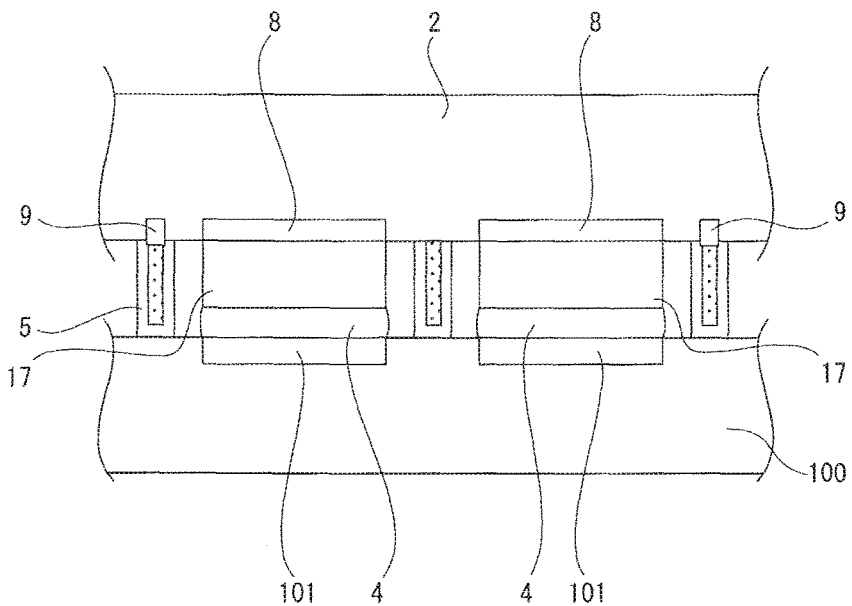

[ FIG. 15 ]
A
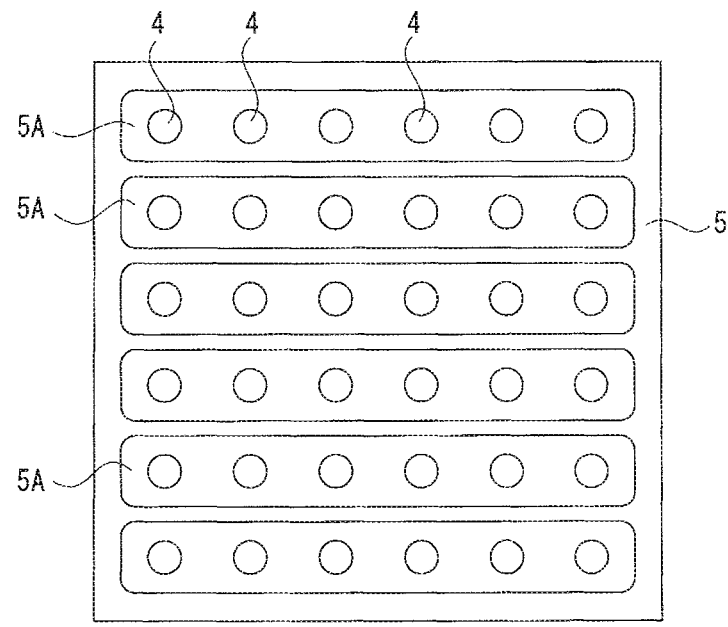
B
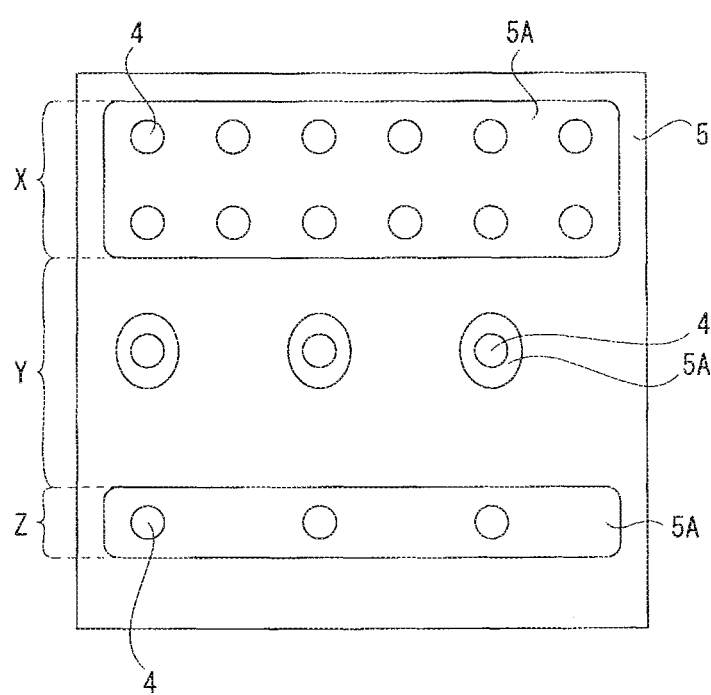

[FIG. 16]
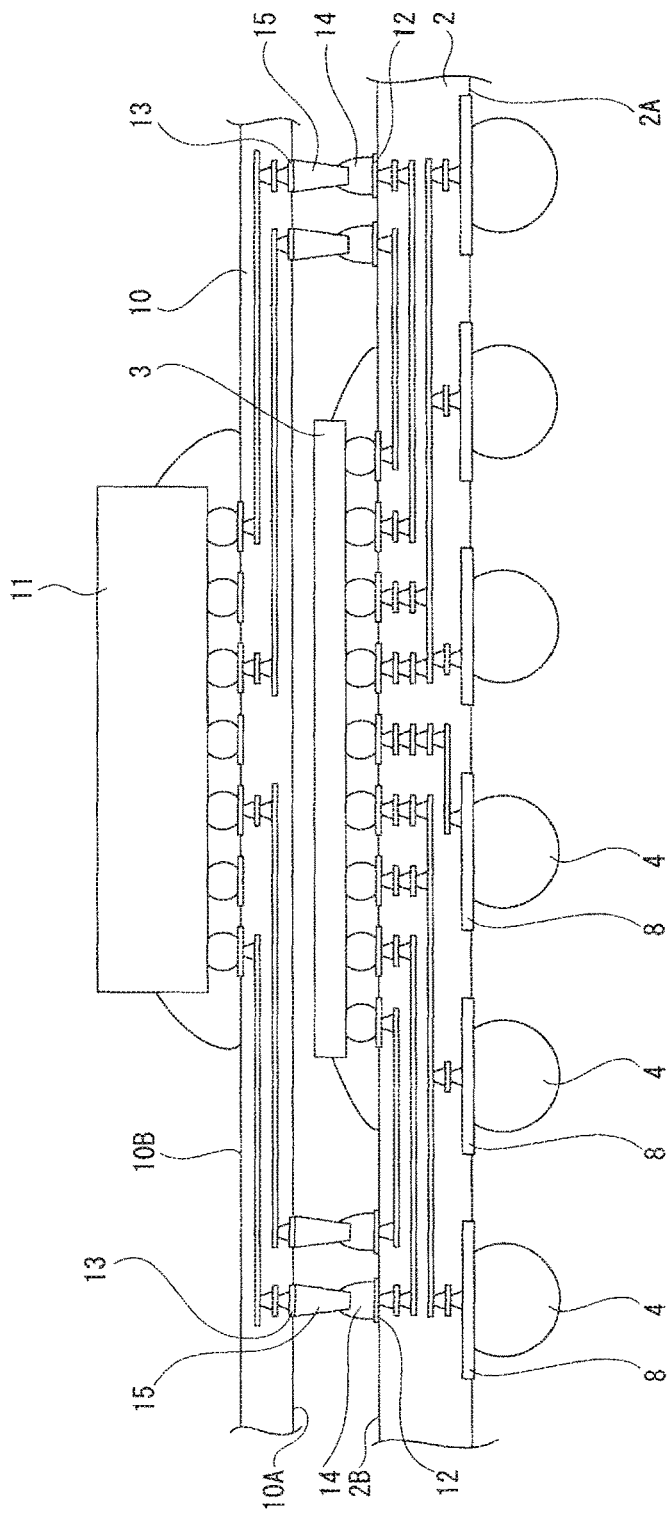

SEMICONDUCTOR DEVICE AND METHOD OF MANUFACTURING SEMICONDUCTOR DEVICE

CROSS REFERENCE TO RELATED APPLICATIONS

This application claims the benefit of Japanese Priority Patent Application JP 2013-050141 filed Mar. 13, 2013, the entire contents which are incorporated herein by reference.

TECHNICAL FIELD

The present technology relates to a semiconductor device having a configuration in which a semiconductor chip is laminated on a wiring substrate and a method of manufacturing the same.

CITATION LIST

Patent Literature

[PTL 1] Japanese Unexamined Patent Application Publication No. 2002-26171
[PTL 2] Japanese Unexamined Patent Application Publication No. 2010-161419
[PTL 3] Japanese Unexamined Patent Application Publication No. H10-335547

BACKGROUND ART

In recent years, speed and functionality of semiconductor chips (IC (Integrated Circuit) chips) used as microprocessors of computers, cellular phones, and the like have been enhanced more and more. Accordingly, there has been a tendency to increase the number of terminals, thereby narrowing a pitch between terminals. Typically, a large number of terminal sections are disposed in an array on a bottom surface of an IC chip.

Since there is a large difference in pitch between the terminal sections in such an IC chip and connection terminals formed on a circuit board called "motherboard", it is difficult to mount the IC chip on the motherboard.

Therefore, to connect the IC chip to the motherboard, a structure called "semiconductor package" that includes a wiring substrate, and the IC chip and the like mounted on the wiring substrate is formed, and the wiring substrate is mounted on (connected to) the motherboard. Thus, the IC chip is connected to the motherboard through the wiring substrate.

Examples of the above-described wiring substrate may include a so-called coreless type wiring substrate that is configured of a laminate formed by laminating a plurality of insulating layers and a plurality of wiring layers by a buildup method, and does not include a core layer (a core substrate) (for example, refer to the above-described PTLs 1 and 2). Since such a coreless type wiring substrate does not include the core substrate, an entire wiring length in the careless type wiring substrate is reduced to reduce transmission loss of a high-frequency signal. Accordingly, the IC chip is allowed to operate at high speed.

In the above-described wiring substrate, respective wiring layers are connected to one another through respective vias, and a plurality of lands connected to the via are provided to each of the wiring layers.

In the above-described semiconductor package, further downsizing and further enhancement of operation speed and density are desired, and a reduction in parasitic inductance and enhancement of accuracy of control on impedance of a signal line are desired accordingly.

Under present circumstances, impedance control is performed in a same wiring layer of the wiring substrate. The impedance control in this case is executed by a stripline or a microstripline.

In a case where a transmission signal frequency is further increased, and, for example, a signal of 10 GHz or over is transmitted from a semiconductor package to a motherboard, by an influence of impedance, transmission is most limited in a BGA (Ball Grid Array) section other than the wiring layer of the wiring substrate.

Under present circumstances, the transmission signal frequency is not increased to about 10 GHz; therefore, impedance control on the BGA section is not considered important.

As a configuration enabling impedance control on the BGA section, for example, the above-described PTL 3 discloses a configuration in which a spacer sheet with PTHs (plated through holes) is sandwiched between a BGA surface and the motherboard (refer to FIGS. 4, 5, and the like in PTL 3). In each of the PTHs, a copper wiring is formed to cover a periphery of a solder ball in the BGA section, and use of the copper wiring enables impedance control on the BGA section.

SUMMARY

Technical Problem

However, in a technology described in PTL 3, when the semiconductor package is connected to a circuit board as the motherboard, it is necessary to perform alignment of three components, i.e., the semiconductor package, the PTHs, and the circuit board.

Since the number of alignment points is increased, a probability of misalignment is increased to cause reduction in product yields.

It is desirable to improve yields while enabling impedance control the BGA section.

Solution to Problem

Some embodiments are directed to a semiconductor device that includes a plurality of solder balls on a surface of the semiconductor device; and a retaining body associated with a first solder ball of the plurality of solder balls, separating the first solder ball from at least a second solder ball of the plurality of solder balls. The retaining body includes a conductive portion and an insulating portion configured to cover the conductive portion. In some embodiments, the retaining body is ring-shaped.

In some embodiments, the semiconductor device further includes a wiring substrate, wherein the surface of the semiconductor device is a first surface of the wiring substrate. The semiconductor device may further include a semiconductor chip electrically connected to the wiring substrate. In some embodiments, the semiconductor chip is mounted on a second surface opposed to the first surface of the semiconductor device. In some embodiments, the wiring substrate is a laminated structure comprising a plurality of layers. The plurality of layers may include at least one insulating layer and at least one wiring layer. In some embodiments, the at least one insulating layer and the at least one wiring layer may alternate.

In some embodiments, the wiring substrate is a first wiring substrate and the semiconductor device further comprises a second wiring substrate electrically connected to the first wiring substrate.

In some embodiments, the second wiring substrate is electrically connected to the first wiring substrate by at least one metal post. In other embodiments, the second wiring substrate is electrically connected to the first wiring substrate by at least one solder ball different from the plurality of solder balls on the first surface of the first wiring substrate. The at least one solder ball different from the plurality of solder balls on the first surface of the first wiring substrate may be on a second surface opposed to the first surface of the semiconductor device.

In some embodiments, the second wiring substrate is electrically connected to the first wiring substrate by at least one solder ball different from the plurality of solder balls on the first surface of the first wiring substrate and at least one metal post.

In some embodiments, the semiconductor device includes a ground terminal associated with the retaining body, wherein the conductive portion of the retaining body is electrically connected to the ground terminal.

In some embodiments, the conductive portion of the retaining body comprises a conductive resin.

In some embodiments, the insulating portion of the retaining body comprises an insulating resin.

In some embodiments, the retaining body is a first retaining body of a plurality of retaining bodies, each of the plurality of retaining bodies associated with a respective solder ball of the plurality of solder balls.

Some embodiments are directed to a method of manufacturing a semiconductor device. The method includes forming a plurality of retaining bodies on a surface of a wiring substrate, each retaining body comprising a conductive portion and an insulating portion covering the conductive portion, each retaining body forming an opening section; and forming a solder ball in the opening section formed by each of the retaining bodies.

In some embodiments, forming the plurality of retaining bodies on a surface of a wiring substrate includes: forming the conductive portion of each retaining body using injection molding of a conductive resin; and forming the insulating portion of each retaining body using injection molding of an insulating resin after forming the conductive portion. In other embodiments, forming the plurality of retaining bodies on a surface of a wiring substrate comprises: forming a first portion of the insulating portion of each retaining body, the first portion of the insulating portion comprising a groove section; forming the conductive portion of each retaining body in the groove section; and forming a second portion of the insulating portion of each retaining body to cover the conductive portion in the groove section.

Advantageous Effects of Invention

In the above-described embodiments of the present technology, the retaining body formed on the BGA surface includes the conductive section that is formed to separate the solder balls from one another; therefore, impedance control on the BGA surface is enabled with use of the conductive section.

On that basis, in the semiconductor device according to the above-described embodiment of the present technology, the first wiring substrate having the BGA surface on which the retaining body is formed is to be connected to the circuit board; therefore, in alignment in a case where the semiconductor device is connected to the circuit board, it is only necessary to perform alignment of two components, i.e., the semiconductor device and the circuit board.

Therefore, an improvement in yields is achievable while enabling impedance control.

It is to be understood that both the foregoing general description and the following detailed description are exemplary, and are intended to provide further explanation of the technology as claimed.

BRIEF DESCRIPTION OF DRAWINGS

FIG. 1 is an explanatory diagram of a configuration of a semiconductor device according to a first embodiment.

FIG. 2 is an explanatory diagram of a diameter difference in a solder ball configuring a BGA.

FIG. 3 is an explanatory diagram of an allowable range of diameter difference.

FIG. 4 is a diagram for describing an example of a brief flow of a method of manufacturing the semiconductor device.

FIG. 5 is a diagram for describing another example of the brief flow of the method of manufacturing the semiconductor device.

FIG. 6 is an explanatory diagram of a first method of forming a retaining body.

FIG. 7 is an explanatory diagram of a second method of forming the retaining body.

FIG. 8 is an explanatory diagram of a third method of forming the retaining body.

FIG. 9 is a diagram illustrating a configuration example of a semiconductor device with a PoP configuration.

FIG. 10 is a diagram illustrating a sectional configuration of a semiconductor device according to a second embodiment.

FIG. 11 is an explanatory diagram of a method of forming a metal post.

FIG. 12 is a diagram illustrating another example of a position where a metal post is formed.

FIG. 13 is a diagram illustrating still another example the of position where the metal post is formed.

FIG. 14 is an explanatory diagram of a modification example in which the metal post is formed on a BGA surface.

FIG. 15 is a diagram illustrating a modification example of a configuration of the retaining body.

FIG. 16 is a diagram exemplifying a configuration without the retaining body.

DESCRIPTION OF EMBODIMENTS

Some embodiments of the present technology will be described below.

It is to be noted that description will be given in the following order.

(1. First Embodiment)
(1-1. Configuration of semiconductor device)
(1-2. Method of manufacturing semiconductor device)
(1-3. Summary of first embodiment)
(2. Second Embodiment)
(2-1. Configuration of semiconductor device)
(2-2. Method of manufacturing semiconductor device)
(2-3. Summary of second embodiment)
(3. Modification Examples)

1. First Embodiment

1-1. Configuration of Semiconductor Device

FIG. 1 is an explanatory diagram of a configuration of a semiconductor device 1 according to a first embodiment of the present technology. A of FIG. 1 is a sectional view of the semiconductor device 1, B of FIG. 1 is a bottom view of the semiconductor device 1, and C of FIG. 1 is an enlarged sectional view of a region in proximity to a BGA surface of the semiconductor device 1.

As illustrated in A of FIG. 1, the semiconductor device 1 includes a wiring substrate 2, a semiconductor chip 3, a plurality of solder balls 4, and a retaining body 5. Although not illustrated, the wiring substrate 2 is formed by alternately laminating wiring layers in which a wiring electrically connected to a predetermined terminal of the semiconductor chip 3 is formed, and insulating layers. A through hole (a via hole) is formed in each of the insulating layers, and the wirings of the respective wiring layers are connected to one another by a conductor filled in the through holes. In this example, the wiring substrate 2 is a so-called coreless substrate not including a core layer.

The semiconductor chip 3 is mounted on one surface of the wiring substrate 2. Although not illustrated, a plurality of pads for electrically connecting a plurality of terminals formed in the semiconductor chip 3 to respective predetermined wirings in the wiring layers are formed on the one surface of the wiring substrate 2. The terminals of the semiconductor chip 3 and the pads may be bonded together by, for example, flip-chip interconnection, or the like. As an example of the semiconductor chip 3, an IC (Integrated Circuit) chip such as an SDRAM (Synchronous Dynamic Random Access Memory) may be used. Thus, the semiconductor device 1 according to this embodiment has a configuration as a so-called semiconductor package in which the semiconductor chip 3 is mounted on the wiring substrate 2.

A surface opposite to the surface where the semiconductor chip 3 is mounted of the wiring substrate 2 is a BGA (Ball Grid Array) surface 2A for making connection to a circuit substrate (a motherboard) that is not illustrated. The plurality of solder balls 4 are formed on the BGA surface 2A. As illustrated in C of FIG. 1, pads 8 are formed at positions where the solder balls 4 are supposed to be formed on the BGA surface 2A, and the respective solder balls 4 are formed corresponding to the respective pads 8. Although not illustrated, the respective pads 8 are electrically connected to respective predetermined wirings formed in the wiring layers in the wiring substrate 2. In other words, the respective pads 8 are electrically connected to respective predetermined terminals of the semiconductor chip 3 through the wirings formed in the wiring layers.

The respective solder balls 4 formed on the respective pads 8 are connected to terminals (pads 101) formed at respective predetermined positions on a circuit board (a circuit board 100 that will be described later) as a motherboard. Thus, the semiconductor chip 3 is electrically connected to a wiring in the circuit board 100 through the wirings formed in the wiring substrate 2.

In the semiconductor device 1 according to this embodiment, the retaining body 5 is formed on the BGA surface 2A of the wiring substrate 2. In the retaining body 5, a plurality of opening sections 5A are formed at positions corresponding to positions where the solder balls 4 are formed. More specifically, the opening sections 5A in this example are so formed as to have a one-to-one relationship with the solder balls 4. Arrangement spaces for the solder balls 4 on the BGA surface 2A are secured by the opening sections 5A.

As illustrated in C of FIG. 1, the retaining body 5 includes conductive sections 6 and an insulating section 7. In this example, a conductive resin may be used for the conductive sections 6, and an insulating resin may be used for the insulating section 7. As the conductive resin, for example, a resin material containing a conductive material may be used. At this time, in a case where a particulate conductive material is contained as the above-described conductive material, for example, silver, nickel, copper, gold, carbon, or the like may be used. Moreover, in a case where a fiber conductive material is contained, carbon is suitable. Alternatively, for example, a resin containing gold, copper or nickel as metal-coated plastic particles may be used.

Moreover, as the insulating resin, a resin material containing an insulating material is used, and, for example, an insulating material such as silica, alumina, or silicone may be contained as a filler. It is to be noted that examples of the resin material used for the conductive resin and the insulating resin may include epoxy, polyurethane, acrylic, SBS (styrene-butadienestyrene block copolymer), SEBS (styrene-ethylene-butadiene-styrene block copolymer), and PVB (polyvinyl butyral).

The conductive sections 6 are so formed as to separate the solder balls 4 formed on the BGA surface 2A from one another. More specifically, in this example, one conductive section 6 having a shape of a ring is formed for one solder ball 4 so as to cover a peripheral surface of the one solder ball 4. Thus, a so-called "coaxial structure" is achieved. In the retaining body 5 in this example, the conductive sections 6 formed in such a ring shape equal in number to the solder balls 4 are provided.

The insulating section 7 is so formed as to cover the conductive sections 6. The retaining body 5 is configured of the conductive sections 6 and the insulating section 7 that is so formed as to cover the conductive sections 6. Thus, as illustrated in B of FIG. 1, the retaining body 5 is so formed as to have the opening sections 5A at positions corresponding to the positions where the solder balls 4 are formed.

The retaining body 5 formed in such a manner has a function of suppressing warpage deformation of the wiring substrate 5 not including the core substrate. In other words, the retaining body 5 functions as a retaining substrate for retaining the shape (flatness) of the wiring substrate 2.

In this embodiment, the respective conductive sections 6 are electrically connected to respective ground terminals 9 formed on the BGA surface 2A of the wiring substrate 2, as illustrated in C of FIG. 1. Therefore, impedance control on transmission lines through the solder balls 4 (that is, connection pins to the motherboard) surrounded by the conductive sections 6 is allowed to be performed.

Impedance in a BGA is dependent on a relationship between a sectional diameter d of the solder ball 4 and an inner diameter D of the conductive section 5 having a shape of a ring, as illustrated in a sectional view in A of FIG. 2. B of FIG. 2 is a sectional view illustrating a status around a connection section between the wiring substrate 2 and the circuit board 100 when the respective solder balls 4 are connected to the respective pads 101 for solder ball connection formed on the circuit board 100. As illustrated in B of FIG. 2, in the solder balls 4 bonded to the circuit board 100, there is a diameter difference delta-d as a difference between a minimum sectional diameter d1 and a maximum sectional diameter d2.

When such a diameter difference delta-d is small, variation in impedance is reduced, and appropriate impedance control is achievable. On the other hand, when the diameter difference delta-d is large, variation in impedance is increased, and it is difficult to achieve appropriate impedance control.

Therefore, in this embodiment, the diameter difference delta-d is reduced by a following way. FIG. 3 is an explanatory diagram of an allowable range of the diameter difference delta-d, and illustrates a relationship between the sectional diameter d and the inner diameter D when impedance is 50 ohms, 40 ohms, or 60 ohms, where a horizontal axis indicates the inner diameter D (mm), and a vertical axis indicates the sectional diameter d (mm).

The BGA section may be preferably designed to have an impedance of about 50 ohms, and variation in impedance allowable to achieve appropriate impedance control is typically within a range of about +/−20% of a design value (that is, about 50 ohms). FIG. 3 illustrates a relationship (indicated by a diamond mark) between the inner diameter D and the sectional diameter d at −20% (40 ohms) with respect to the design value of impedance and a relationship (indicated by a triangle mark) between the inner diameter D and the sectional diameter d at +20% (60 ohms) with respect to the design value of impedance. As can be seen from FIG. 3, the relationship between the inner diameter D and the sectional diameter d at an upper limit (60 ohms) of variation with respect to the design value is d/D=about 36.5%, and the relationship between the inner diameter D and the sectional diameter d when the impedance is at a lower limit (40 ohms) with respect to the design value is d/D=about 51%.

In this embodiment, based on this, the semiconductor device 1 is so formed as to allow the relationship between the inner diameter D and the sectional diameter d when the solder balls 4 are bonded to the circuit board 100 to be d/D=about 36.5% to about 51%. Thus, impedance control on the BGA section is allowed to be appropriately performed. It is to be noted that, with respect to a condition of the above-described "d/D", the sectional diameter d refers to all sectional diameters d from the minimum sectional diameter d1 to the maximum sectional diameter d2.

1-2. Method of Manufacturing Semiconductor Device

Next, a method of manufacturing the semiconductor device 1 will be described below referring to FIGS. 4 to 8. First, a brief flow of the method of manufacturing the semiconductor device 1 will be described referring to FIGS. 4 and 5.

It is to be noted that a method of manufacturing the wiring substrate 2 will be described below without referring to drawings. Although the method of manufacturing the wiring substrate 2 as a careless substrate is described in detail in, for example, the above-described PTLs 1 and 2, and the like, the method of manufacturing the wiring substrate 2 will be briefly described for confirmation. As a flow of the method of manufacturing the wiring substrate 2, a laminate in which insulating layers and wiring layers are alternately laminated is formed on, for example, a substrate made of copper as a temporary substrate, and then the temporary substrate remaining on the laminate is removed by, for example, etching or the like. In the wiring substrate 2 in this example, in the above-described manufacturing procedure, a process of forming the above-described pads 8 and the above-described ground terminals 9 is also performed.

As the brief flow of the method of manufacturing the semiconductor device 1, roughly, two examples illustrated in FIGS. 4 and 5 may be adopted. In an example in FIG. 4, first, the semiconductor chip 3 is mounted on the wiring substrate 2 (refer to A of FIG. 4), and the retaining body 5 is formed on the BGA surface 2A of the wiring substrate 2 on which the semiconductor chip 3 is mounted (refer to B of FIG. 4). Then, the solder balls 4 are formed on the BGA surface 2A so as to be inserted into spaces formed by the opening sections 5A of the retaining body 5 (refer to C of FIG. 4).

On the other hand, in an example in FIG. 5, first, the retaining body 5 is formed on the BGA surface 2A of the wiring substrate 2 (refer to A of FIG. 5), and the semiconductor chip 3 is mounted on the wiring substrate 2 on which the retaining body 5 is formed (refer to B of FIG. 5). Then, the solder balls 4 are formed on the BGA surface 2A so as to be inserted into spaces formed by the opening sections 5A of the retaining body 5 (refer to C of FIG. 5).

A specific method of forming the retaining body 5 will be described below referring to FIGS. 6 to 8. As the method of forming the retaining body 5, following three methods may be considered.

FIG. 6 is an explanatory diagram of a first method of forming the retaining body 5.

First, in the first forming method, the conductive sections 6 are formed at predetermined positions on the BGA surface 2A of the wiring substrate 2 (refer to A of FIG. 6). In this example, the conductive sections 6 may be formed by injection molding with use of the above-described conductive resin. At this time, the positions where the conductive sections 6 are formed are so determined as to allow the conductive sections 6 to be connected to the ground terminals 9 on the BGA surface 2A. Thus, the conductive sections 6 electrically connected to the ground terminals 9 are formed.

Next, the insulating section 7 is so formed as to allow the conductive sections 6 formed in the above-described way to be covered therewith (refer to B of FIG. 6). In this example, the insulating section 7 may be formed by injection molding with use of the above-described insulating resin. At this time, molding with use of the insulating resin is performed so as not to cover the pads 8 with the insulating resin. Thus, the arrangement spaces for the solder balls 4 as the opening sections 5A are secured. The retaining body 5 is thus formed on the BGA surface 2A by formation of the above-described insulating section 7.

FIG. 7 is an explanatory diagram of a second method of forming the retaining body 5.

In the second forming method, first, an insulating-section formation member 7a having groove sections 7as and opening sections 5A is formed on the BGA surface 2A (refer to A of FIG. 7). The groove sections 7as are used to form spaces for formation of the conductive sections 6; therefore, each of the groove sections 7as has a ring shape. In this example, the insulating-section formation member 7a having such groove sections 7as may be formed by injection molding with use of the above-described insulating resin. At this time, positions where the groove sections 7as are formed are so determined as to allow spaces as the respective groove sections 7 having a shape of a ring as to be in contact with the respective ground terminals 9 corresponding thereto.

Next, the conductive sections 6 are formed in the groove sections 7as of the insulating-section formation member 7a formed in the above-described way (refer to B of FIG. 7). In this case, the conductive sections 6 are formed through coating the groove sections 7as with a liquid-form conductive resin by, for example, ink-jet printing or the like. Since the positions where the groove sections 7as are formed are determined as described above, the respective conductive sections 6 formed in the respective groove sections 7as are electrically connected to the respective ground terminals 9 corresponding thereto.

Next, an insulating-section formation member 7b is so formed on the insulating-section formation member 7a on which the conductive sections 6 are formed in the groove sections 7as as described above as to cover a surface on a side where the conductive sections 6 are exposed therewith (refer to C of FIG. 7). In this example, the insulating-section formation member 7b may be formed through coating the insulating-section formation member 7a with a liquid-form insulating resin by ink-jet printing or any other printing method. Thus, the insulating section 7 with which the conductive sections 6 are covered is formed to complete the retaining body 5.

FIG. 8 is an explanatory diagram of a third method of forming the retaining body 5.

In the third forming method, first, an insulating-section formation member 7a' that is the insulating-section formation member 7a without the groove sections 7as is formed on the BGA surface 2A (refer to A of FIG. 8). The insulating-section formation member 7a' may be formed also by injection molding with use of the insulating resin.

Next, as illustrated in B of FIG. 8, the groove sections 7as are formed in the insulating-section formation member 7a' by applying laser light to predetermined positions in the insulating-section formation member 7a' from a direction indicated by an arrow L in the drawing. In other words, a structure similar to the insulating-section formation member 7a illustrated in A of FIG. 7 is formed.

Since the groove sections 7as are formed by laser light as described above, the laser light may penetrate the insulating-section formation member 7a' to cause damage to the BGA surface 2A. In consideration of this, in the third forming method, the ground terminals 9 are formed at positions corresponding to positions where laser light is applied to form the groove sections 7as on the BGA surface 2A. In other words, in advance, the ground terminals 9 having a ring shape are formed at positions on the BGA surface 2A corresponding to the above-described positions where laser light is applied. Thus, penetration of the insulating-section formation member 7a' by applied laser light stops at the positions where the ground terminals 9 are formed, thereby preventing damage to the wiring substrate 2.

In the third forming method, processes after forming the insulating-section formation member 7a in the above-described way are similar to those in the second forming method, and will not be further described.

1-3. Summary of First Embodiment

As described above, the semiconductor device 1 according to the first embodiment includes the semiconductor chip 3, the wiring substrate 2, and the retaining body 5. The wiring substrate 2 is formed by alternately laminating the wiring layers that each have a wiring electrically connected to the semiconductor chip 3, and the insulating layers, and has the BGA surface 2A on which a plurality of solder balls 4 are formed to be electrically connected to predetermined ones of the wirings, thereby being electrically connected to the circuit board 100. The retaining body 5 includes the conductive sections 6 that are formed on the BGA surface 2A so as to separate the solder balls 4 from one another, and the insulating section 7 that is formed to cover the conductive sections 6. Since the retaining body 5 formed on the BGA surface 2A includes the conductive sections 6 that are so formed as to separate the solder balls 4 from one another, impedance control on the BGA section is enabled with use of the conductive sections 6. In the semiconductor device 1, the wiring substrate 2 having the BGA surface 2A where the retaining body 5 is formed is connected to the circuit board 100; therefore, when the semiconductor device 1 is connected to the circuit board 100, it is only necessary to perform alignment of two components, i.e., the semiconductor device 1 and the circuit board 100. Thus, an improvement in yields is achievable while enabling impedance control.

Moreover, since, unlike an existing case, it is not necessary to mount the wiring substrate 2 on the circuit board 100 with PTHs (plated through holes) in between, a burden in a process of mounting the wiring substrate 2 on the circuit board 100 is allowed to be reduced. Further, solder sinking in the semiconductor device 1 during reflow is allowed to be maintained constant; therefore, also in this respect, the diameter difference delta-d in the solder balls 4 is allowed to be reduced.

Furthermore, in this embodiment, the conductive sections 6 may be electrically connected to the ground terminals 9 formed on the wiring substrate 2. Therefore, the conductive sections 6 and the wiring substrate 2 are electrically connected to each other by formation of the retaining body 5. In a technology described in the above-described PTL 3, a terminal for electric conduction to the conductive section formed in a PTH is exposed to a peripheral section of the PTH; therefore, a ground terminal for connection to this terminal is provided to an peripheral section of the BGA surface in the wiring substrate, thereby connecting these terminals to each other. On the other hand, in this embodiment, as described above, the conductive sections 6 and the ground terminals 9 are electrically connected to each other by formation of the retaining body 5; therefore, compared to the above-described existing technology, it is not necessary to perform an additional process for connecting the ground terminals in the wiring substrate and the terminals in the PTHs to each other, and the number of processes is reduced accordingly.

Moreover, in this embodiment, the retaining body 5 may have a coaxial structure. Favorable impedance control on transmission lines through the solder balls 4 is achievable by the coaxial structure.

Further, the semiconductor device 1 according to this embodiment may be so formed as to allow the relationship between the inner diameter D and the sectional diameter d to satisfy a condition of d/D=about 36.5% to about 51%. Thus, variation in impedance is limited to +/−20% of the design value (50 ohms), and impedance control is allowed to be performed appropriately.

In addition, in this embodiment, the conductive sections 6 and the insulating section 7 may be formed of the conductive resin and the insulating resin, respectively.

Since the conductive sections 6 and the insulating section 7 are formed of the resins, the retaining body 5 is easily formed, and the number of processes and manufacturing cost are reduced accordingly.

2. Second Embodiment

2-1. Configuration of Semiconductor Device

Next, a second embodiment will be described below.

The second embodiment relates to a semiconductor device with a PoP (Package on Package) configuration that includes, as a lower package, a semiconductor package having the BGA surface 2A for connection to the circuit board 100, as with the above-described semiconductor device 1 according to the first embodiment.

FIG. 9 is a diagram illustrating a configuration example of the semiconductor device with the PoP configuration configured by mounting (laminating), on a semiconductor package having a configuration similar to that of the semiconductor device 1, another semiconductor package.

It is to be noted that like components are denoted by like numerals as of the first embodiment and will not be further described.

In FIG. 9, a plurality of pads 12 for electrical connection to an upper package are formed on a surface (hereinafter referred to as "top surface 2B") opposite to the BGA surface 2A of the wiring substrate 2. The respective pads 12 are electrically connected to predetermined wirings formed in the respective wiring layers of the wiring substrate 2.

The upper package is configured by mounting the semiconductor chip 11 on the wiring substrate 10 as illustrated in the drawing. A surface facing the lower package of the wiring substrate 10 is a "bottom surface 10A", and a surface opposite to the bottom surface 10A is a "top surface 10B". The wiring substrate 10 is a careless substrate formed by alternately laminating wiring layers and insulating layers, as with the wiring substrate 2. Pads 13 for electrical connection to the pads 12 formed on the wiring substrate 2 are formed on the bottom surface 10A of the wiring substrate 10, and the respective pads 13 are electrically connected to predetermined wirings formed in the respective wiring layers of the wiring substrate 10.

The pads 12 formed on the wiring substrate 2 and the pads 13 formed on the wiring substrate 10 are connected to each other through the solder balls 14. Thus, the upper and lower semiconductor packages are electrically connected to each other.

In this case, in the semiconductor device with such a PoP configuration, it is desirable to secure a space (standoff) between the top surface 2B of the wiring substrate 2 and the bottom surface 10A of the wiring substrate 10 so as not to allow the semiconductor chip 3 mounted on the lower package to interfere with the upper package.

In a configuration example illustrated in FIG. 9, the pads 12 in the lower package and the pads 13 in the upper package are connected to each other through the solder balls 14; therefore, it is necessary to increase the size of each of the solder balls 14 to obtain the standoff.

However, when the size of each of the solder balls 14 is increased, the area necessary to bond the upper and lower packages together is also increased; therefore, it is difficult to downsize the packages.

Therefore, in the second embodiment, the upper and lower packages are electrically connected to each other through metal posts.

FIG. 10 is a diagram illustrating a sectional configuration of a semiconductor device 20 according to the second embodiment. As illustrated in FIG. 10, in the semiconductor device 20, a metal post 15 is formed on each of the pads 13 formed on the bottom surface 10A of the wiring substrate 10 configuring the upper package. In this example, the metal posts 15 may be made of copper. Then, the pads 12 of the wiring substrate 2 and the metal posts 15 are connected to each other through the solder balls 14.

In the semiconductor device 20 illustrated in FIG. 10, the standoff is allowed to be obtained by heights of the metal posts 15; therefore, diameters of the solder balls 14 are reduced.

2-2. Method of Manufacturing Semiconductor Device

A method of manufacturing the semiconductor device 20 according to the second embodiment will be described below. It is to be noted that a method of forming the metal posts 15 will be mainly described below to avoid repetition of description of the first embodiment.

FIG. 11 is an explanatory diagram of the method of forming the metal posts 15.

First, a temporary substrate 16 configured of a metal plate as illustrated in A of FIG. 11 is used to form the wiring substrate 10 as a careless substrate. In this example, as the temporary substrate 16, a copper plate may be used.

Laminates 10' as bases of the wiring substrate 10, i.e., laminates with a configuration in which wiring layers and insulating layers are alternately laminated are formed on both surfaces of the temporary substrate 16. At this time, lamination starts from a surface that is supposed to be the bottom surface 10A (hereinafter referred to as "bottom surface 10'A") of the wiring substrate 10. In other words, the wiring layers and the insulating layers are laminated in order from a layer that is supposed to be a lowermost layer to a layer that is supposed to be an uppermost layer.

After the laminates 10' are formed on both surfaces of the temporary substrate 16 as described above, the temporary substrate 16 is partitioned along a direction orthogonal to a laminating direction of the laminates 10' to obtain a laminate structure configured of the partitioned temporary substrate 16 and the laminate 10' (refer to FIG. 11B).

Then, parts of the temporary substrate 16 in the laminate structure are removed to form the metal posts 15 (refer to C of FIG. 11). More specifically, the metal posts 15 in this case are formed by coating the temporary substrate 16 with a resist, and etching the temporary substrate 15 by exposure and development. Alternatively, for example, etching with use of Ni as a barrier metal may be used.

The metal posts 15 are allowed to be formed on the bottom surface 10A of the wiring substrate 10 by such a forming method.

It is to be noted that, as illustrated in FIG. 12, the metal posts 15 may be formed on the top surface 2B of the wiring substrate 2. Alternatively, as illustrated in FIG. 13, the metal posts 15 may be formed on both the bottom surface 10A of the wiring substrate 10 and the top surface 2A of the wiring substrate 2. In any of these cases, since the wiring substrate 2 and the wiring substrate 10 are configured of coreless substrates, the metal posts 15 are allowed to be formed by removing parts of the temporary substrate 16 as described referring to FIG. 11. It is to be noted that, in a case where the metal posts 15 are formed on the top surface 2B of the wiring substrate 2, layers are laminated in order from a layer that is supposed to be an uppermost layer to a layer that is supposed to be a lowermost layer.

2-3. Summary of Second Embodiment

As described above, in the second embodiment, as the semiconductor device with the PoP configuration, the wiring substrate 10 and the wiring substrate 2 are electrically connected to each other through the metal posts 15 under a state in which the bottom surface 10A of the wiring substrate 10 and the top surface 2B of the wiring substrate 2 face each other. Thus, the diameters of the solder balls 14 for electrically connecting the wiring substrate 2 and the wiring substrate 10 to each other are allowed to be reduced. Accordingly, the area necessary to bond the upper and lower semiconductor packages together is allowed to be reduced, thereby achieving downsizing of the packages.

Moreover, in the second embodiment, each of the wiring substrate 2 and the wiring substrate 10 may be configured of a coreless substrate. Therefore, the metal posts 15 are allowed to be formed by removing parts of the temporary substrate 16, and the temporary substrate 16 that is originally supposed to be entirely removed is allowed to be used effectively. Thus, manufacturing cost is allowed to be reduced. Further, it is not necessary to perform an additional forming process by plating or the like to form the metal posts 15; therefore, the number of processes is allowed to be reduced, and also in this respect, manufacturing cost is allowed to be reduced.

3. Modification Examples

Although the present technology is described referring to the above-described embodiments, the present technology is not limited thereto. For example, as illustrated in FIG. 14, metal posts may be formed on the BGA surface 2A of the wiring substrate 2. More specifically, as illustrated in A of FIG. 14, metal posts 17 protruding from the BGA surface 2A toward a direction of connection to the circuit board 100 may be formed. These metal posts 17 may be made of, for example, copper.

In this case, the metal posts 17 are formed corresponding to the pads 8 formed on the BGA surface 2A. Then, the solder balls 4 are formed on ends of the metal posts 17.

Thus, the solder balls 4 formed on the ends of the metal posts 17 are connected to pads 101 of the circuit board 100, as illustrated in B of FIG. 14.

In this modification example, the volumes of the solder balls 4 are reduced by inserting the metal posts 17 between the pads 8 and the pads 101, thereby reducing the diameter difference delta-d in the solder balls 4. Thus, variation in impedance is allowed to be reduced, and more favorable impedance control is achievable.

It is to be noted that the metal posts 17 may be formed by the method of removing parts of the temporary substrate 16 described above referring to FIG. 11. In this case, layers are laminated on the temporary substrate 16 in order from a layer that is supposed to be a lowermost layer of the wiring substrate 2.

In the above description, a case where the retaining body 5 has only a coaxial structure as illustrated B of FIG. 11 is exemplified; however, the retaining body 5 may have only a microstripline structure or a stripline structure as illustrated in A of FIG. 15. In the microstripline structure or the stripline structure, each of the opening sections 5A is so formed as to surround two or more of the solder balls 4 with an outer edge thereof as illustrated in the drawing. Although not illustrated, the conductive section 6 in this case is formed along an outer side of the outer edge of such an opening section 5A.

The microstripline structure or the stripline structure is suitable in a case where gaps between the solder balls 4 are narrowed due to restriction on the formation pitches and diameters of the solder balls 4, or the like. In other words, when the retaining body 5 has the microstripline structure or the stripline structure, impedance control is allowed to be performed on a region where the gaps between the solder balls 4 are narrow.

Moreover, in a case where it is difficult to adopt the coaxial structure in an entire region of the retaining body 5 due to restriction on the area of the BGA surface 2A, or the like, measures may be taken by partially changing the formation pitches of the solder balls 4, or the like. For example, in an example illustrated in B of FIG. 15, in a case where a region X in the drawing is a region where a wiring other than signal lines is concentrated, impedance control is not necessary in the region X; therefore, the formation pitches of the solder balls 4 are reduced to increase the area of the retaining body 5 except for the region X. Then, in a case where a region Y in the drawing is a region where signal lines are concentrated, the region Y adopts a coaxial structure by widening the formation pitches of the solder balls 4 in the region Y by the increased area of the retaining body except for the region X. Alternatively, as illustrated in a region Z in the drawing, a microstripline structure or a stripline structure may be adopted instead of the coaxial structure to further increase the area of the retaining body 5 except for the region X. It is to be noted that, in a case where the areas of the opening sections 5A are increased by adopting a structure other than the coaxial structure, it is preferable that a decline in retention be considered. In other words, in a case where the coaxial structure and the microstripline structure or the stripline are mixed, a mixing ratio, an arrangement pattern, and the like of these structures are preferably determined in consideration of retention with respect to the wiring substrate.

Moreover, in the second embodiment, to reduce the area necessary to bond the upper and lower semiconductor packages together, as illustrated in FIG. 16, a configuration without the retaining body 5 may be adopted. It is to be noted that, in FIG. 16, a case where the metal posts 15 are formed on the wiring substrate 10 is exemplified; however, as a configuration without the retaining body 5, as illustrated in FIG. 12 or 13, a configuration in which the metal posts 17 are formed on the wiring substrate 2 or a configuration in which the metal posts 17 are formed on both the wiring substrate 2 and the wiring substrate 10 may be adopted.

The present technology may have following configurations.

(1) A semiconductor device comprising: a plurality of solder balls on a surface of the semiconductor device; and a retaining body associated with a first solder ball of the plurality of solder balls, separating the first solder ball from at least a second solder ball of the plurality of solder balls, wherein the retaining body comprises: a conductive portion; and an insulating portion configured to cover the conductive portion.

(2) The semiconductor device of (1), wherein the retaining body is ring-shaped.

(3) The semiconductor device of (1), further comprising a wiring substrate, wherein the surface of the semiconductor device is a first surface of the wiring substrate.

(4) The semiconductor device of (3), further comprising a semiconductor chip electrically connected to the wiring substrate.

(5) The semiconductor device of (4), wherein the semiconductor chip is mounted on a second surface opposed to the first surface of the semiconductor device.

(6) The semiconductor device of (3), wherein the wiring substrate is a laminated structure comprising a plurality of layers.

(7) The semiconductor device of (6), wherein the plurality of layers comprise at least one insulating layer and at least one wiring layer.

(8) The semiconductor device of (7), wherein the at least one insulating layer and at least on wiring layer alternate.

(9) The semiconductor device of (3), wherein the wiring substrate is a first wiring substrate and the semiconductor device further comprises a second wiring substrate electrically connected to the first wiring substrate.

(10) The semiconductor device of (10), wherein the second wiring substrate is electrically connected to the first wiring substrate by at least one metal post.

(11) The semiconductor device of (9), wherein the second wiring substrate is electrically connected to the first wiring substrate by at least one solder ball different from the plurality of solder balls on the first surface of the first wiring substrate.

(12) The semiconductor device of (11), wherein the at least one solder ball different from the plurality of solder balls on the first surface of the first wiring substrate is on a second surface opposed to the first surface of the semiconductor device.

(13) The semiconductor device of (9), wherein the second wiring substrate is electrically connected to the first wiring substrate by at least one solder ball different from the plurality of solder balls on the first surface of the first wiring substrate and at least one metal post.

(14) The semiconductor device of (1), further comprising a ground terminal associated with the retaining body, wherein the conductive portion of the retaining body is electrically connected to the ground terminal.

(15) The semiconductor device of (1), wherein the conductive portion of the retaining body comprises a conductive resin.

(16) The semiconductor device of (1), wherein the insulating portion of the retaining body comprises an insulating resin.

(17) The semiconductor device of (1), wherein the retaining body is a first retaining body of a plurality of retaining bodies, each of the plurality of retaining bodies associated with a respective solder ball of the plurality of solder balls.

(18) A method of manufacturing a semiconductor device, the method comprising: forming a plurality of retaining bodies on a surface of a wiring substrate, each retaining body comprising a conductive portion and an insulating portion covering the conductive portion, each retaining body forming an opening section; and forming a solder ball in the opening section formed by each of the retaining bodies.

(19) The method of (18), wherein forming the plurality of retaining bodies on a surface of a wiring substrate comprises: forming the conductive portion of each retaining body using injection molding of a conductive resin; and forming the insulating portion of each retaining body using injection molding of an insulating resin after forming the conductive portion.

(20) The method of (18), wherein forming the plurality of retaining bodies on a surface of a wiring substrate comprises: forming a first portion of the insulating portion of each retaining body, the first portion of the insulating portion comprising a groove section; forming the conductive portion of each retaining body in the groove section; and forming a second portion of the insulating portion of each retaining body to cover the conductive portion in the groove section.

The present technology may also have following configurations.

(A) A semiconductor device including:
a first semiconductor chip;
a first wiring substrate in which wiring layers and insulating layers are alternately laminated, and including a ball grid array (BGA) surface on which a plurality of solder balls are provided, the wiring layers each having a wiring electrically connected to the first semiconductor chip, and the solder balls being electrically connected to predetermined ones of the wirings and configured to be electrically connected to a circuit board; and
a retaining body including a conductive section and an insulating section, the conductive section being provided on the BGA surface to separate the solder balls from one another, and the insulating section being provided to cover the conductive section.

(B) The semiconductor device according to (A), in which the conductive section is electrically connected to a ground terminal provided on the first wiring substrate.

(C) The semiconductor device according to (A) or (B), in which the retaining body has a coaxial structure as a structure in which the retaining body has a coaxial structure as a structure in which the single conductive section having a shape of a ring is provided for the single solder ball to cover a peripheral surface of the corresponding solder ball.

(D) The semiconductor device according to (C), in which a relationship between an inner diameter of the conductive section and a sectional diameter of the solder ball covered with the conductive section in the coaxial structure satisfies a condition of d/D=about 36.5% to about 51% both inclusive, where D is the inner diameter, and d is the sectional diameter.

(E) The semiconductor device according to any one of (A) to (D), in which the conductive section and the insulating section are formed of a conductive resin and an insulating resin, respectively.

(F) The semiconductor device according to any one of A) to (E), further including:
a second semiconductor chip; and
a second wiring substrate in which wiring layers and insulating layers are alternately laminated, the wiring layers each having a wiring electrically connected to the second semiconductor chip,
in which the second wiring substrate and the first wiring substrate are electrically connected to each other through a first metal post, with a surface opposite to a surface connected to the second semiconductor chip of the second wiring substrate being opposed to a surface opposite to the BGA surface of the first wiring substrate.

(G) The semiconductor device according to (F), in which one of the first wiring substrate and the second wiring substrate is a careless substrate.

(H) The semiconductor device according to any one of (A) to (G), in which the solder balls are provided on ends of second metal posts, the second metal posts being electrically connected to predetermined ones of the wirings and protruding from the BGA surface.

(I) The semiconductor device according to any one of (A) to (H), in which the retaining body has one of a microstripline structure and a stripline structure.

(J) A method of manufacturing a semiconductor device, the method including: forming a first wiring substrate by alternately laminating wiring layers and insulating layers, the wiring layers each having a wiring electrically connected to the first semiconductor chip, and
forming a retaining body including a conductive section that separates a plurality of solder balls from one another and an insulating section, the conductive section being formed on a ball grid array (BGA) surface that is a surface of the first wiring substrate and on which the plurality of solder balls are formed, the solder balls being electrically connected to predetermined ones of the wirings and being configured to be electrically connected to a circuit board, and the insulating section being formed to cover the conductive section.

(K) The method of manufacturing the semiconductor device according to (J), in which, in the forming of the first wiring substrate, a ground terminal is formed at a position where the conductive section is formed on the BGA surface.

(L) The method of manufacturing the semiconductor device according to (J) or (K), in which, in the forming of the retaining body, the retaining body is formed to have a coaxial structure as a structure in which the single conductive section having a shape of a ring is provided for the single solder ball to cover a peripheral surface of the corresponding solder ball.

(M) The method of manufacturing the semiconductor device according to any one of (J) to (L), in which, in the forming of the retaining body, the conductive section and the insulating section are formed of a conductive resin and an insulating resin, respectively.

(N) The method of manufacturing the semiconductor device according to any one of (J) to (M), further including
electrically connecting a second wiring substrate and the first wiring substrate to each other through a first metal post, with a surface opposite to a surface connected to the second semiconductor chip of the second wiring substrate being opposed to a surface opposite to the BGA surface of the first wiring substrate, the second wiring substrate in which wiring layers and insulating layers are alternately laminated, and the wiring layers each having a wiring electrically connected to a second semiconductor chip.

(O) The method of manufacturing the semiconductor device according to (N), further including
forming the first metal post by removing a part of a temporary substrate, the temporary substrate being used to form one of the first wiring substrate and the second wiring substrate that is a coreless substrate.

(P) The method of manufacturing the semiconductor device according to an one of (J) to (O), further including:
forming, on the first wiring substrate, second metal posts electrically connected to predetermined ones of the wirings and protruding from the BGA surface; and
forming the solder balls on ends of the second metal posts.

(Q) The method of manufacturing the semiconductor device according to any one of (J) to (P), in which, in the forming of the retaining body, the retaining body is formed to have one of a microstripline structure and a stripline structure.

It should be understood by those skilled in the art that various modifications, combinations, sub-combinations, and alterations may occur depending on design requirements and other factors insofar as they are within the scope of the appended claims or the equivalents thereof.

REFERENCE SINGS LIST 1, 20 semiconductor device
2, 10 wiring substrate
3, 11 semiconductor chip
4, 14 solder ball
5 retaining body
6 conductive section
7 insulating section
15, 17 metal post
16 temporary substrate

The invention claimed is:

1. A method of manufacturing a mounting device, the method comprising:
providing a wiring substrate;
forming a plurality of solder balls disposed on a surface of the wiring substrate; and
forming a retaining body of a plurality of retaining bodies, the retaining body associated with at least a first solder ball of the plurality of solder balls, the retaining body extending from the surface of the wiring substrate along the first solder ball and separating the first solder ball from at least a second solder ball of the plurality of solder balls, wherein the retaining body comprises a conductive portion and an insulating portion completely covering the conductive portion;
forming the plurality of retaining bodies includes forming the conductive portion of each retaining body using injection molding of a conductive resin; and
forming the insulating portion of each retaining body using injection molding of an insulating resin after forming the conductive portion.

2. A method of manufacturing a mounting device, the method comprising:
providing a wiring substrate;
forming a plurality of solder balls disposed on a surface of the wiring substrate; and
forming a retaining body of a plurality of retaining bodies, the retaining body associated with at least a first solder ball of the plurality of solder balls, the retaining body extending from the surface of the wiring substrate along the first solder ball and separating the first solder ball from at least a second solder ball of the plurality of solder balls, wherein the retaining body comprises a conductive portion and an insulating portion completely covering the conductive portion;
forming a first portion of the insulating portion of each retaining body, the first portion of the insulating portion comprising a groove section;
forming the conductive portion of each retaining body in the groove section; and
forming a second portion of the insulating portion of each retaining body to cover the conductive portion in the groove section.

* * * * *